United States Patent [19]

Takahashi et al.

[11] Patent Number: 5,204,971
[45] Date of Patent: Apr. 20, 1993

[54] VEHICLE SOUND SYSTEM

[75] Inventors: Masahiro Takahashi; Yoshikatsu Watanabe, both of Iwaki, Japan

[73] Assignee: Alpine Electronics, Inc., Tokyo, Japan

[21] Appl. No.: 766,615

[22] Filed: Sep. 26, 1991

[30] Foreign Application Priority Data

Oct. 5, 1990 [JP] Japan .............................. 2-104940[U]

[51] Int. Cl.⁵ .......................... H04B 1/18; H04B 1/00
[52] U.S. Cl. ................... 455/185.1; 455/186.1; 455/186.2; 455/238.1; 455/345; 381/86
[58] Field of Search ............... 455/238.1, 345, 186.1, 455/186.2, 185.1, 200.1; 381/86

[56] References Cited

U.S. PATENT DOCUMENTS 4,864,246  9/1989  Kato et al. ......................... 455/238
4,933,987  6/1990  Parks .
5,027,432  6/1991  Skala et al. ......................... 455/238
5,081,707  1/1992  Schorman et al. ................... 455/345

*Primary Examiner*—Reinhard J. Eisenzopf
*Assistant Examiner*—Almaz Woldu
*Attorney, Agent, or Firm*—Guy W. Shoup; Norman R. Klivans

[57] ABSTRACT

A sound system for a vehicle detects the amount of noise, such as road noise, and automatically controls the audio volume in accordance with the noise amount. There are provided a plurality of tables, in which the relationships among the present volume, the noise amount and the volume increase amount of the audio signal are stored. Once one of the plurality of tables is selected by using a table selection key according to the type of the vehicle or the sound system, the volume is automatically controlled based on the characteristic of the selected table.

5 Claims, 4 Drawing Sheets

| NOISE VALUE | LEVEL |
|---|---|
| 0 ~ 0.46875 | 1 |
| 0.46876 ~ 0.78125 | 2 |
| 0.78126 ~ 1.09375 | 3 |
| 1.09376 ~ 1.40625 | 4 |
| 1.40626 ~ 1.71875 | 5 |
| 1.71876 ~ 2.03125 | 6 |
| 2.03126 ~ 2.34375 | 7 |
| 2.34376 ~ 2.65625 | 8 |
| 2.65626 ~ 2.96875 | 9 |
| 2.96876 ~ 3.28125 | A |
| 3.28126 ~ 3.59375 | B |
| 3.59376 ~ 3.90625 | C |
| 3.90626 ~ 4.21875 | D |
| 4.21876 ~ 4.55125 | E |
| 4.55126 ~ 4.84375 | F |

VEHICLE SOUND SYSTEM

BACKGROUND OF THE INVENTION

1. Field of the Invention

The present invention relates to a sound system for a vehicle, and more particularly, to a sound system capable of increasing and decreasing the volume value of a reproduced audio signal in accordance with the level of road noise caused by the movement of a vehicle.

2. Description of the Related Art

In a vehicle sound system, since reproduced sound is masked by the influence of noise from the engine or what is called road noise arising between tires and the surface of a road, it is necessary to adjust the audio volume of the sound system in accordance with the level of such noise.

Conventionally, the reproduced sound is prevented from being masked by detecting road noise by means of a microphone or the like and controlling the electronic volume so as to obtain a volume value corresponding to the road noise. FIG. 5 shows the relationship between the noise value and the volume value. Referring to FIG. 5, the horizontal axis and the vertical axis indicate the road noise value and the volume value, respectively. The volume value is controlled based on this relationship. For example, if the reproduced audio volume is −40 dB (point a), when the value of the road noise is increased to 3 V, the audio volume is also increased to the volume corresponding to the noise value of 3 V, for example, −20 dB (point b).

Since the volume control characteristic shown in FIG. 5 is normally set previous to the shipment of a vehicle sound system, it cannot be changed after the vehicle sound system is mounted on a vehicle. In other words, since the degree of influence of road noise on reproduced sound varies according to the vehicle, when the volume control characteristic is predetermined, even if the volume value is increased by the same amount in response to the increase of noise, the reproduced sound is still masked in some vehicles while the volume value is too high and the reproduced sound level is too high in other vehicles. Therefore, it is not practically possible to determine the volume control characteristic at the shipment of a vehicle sound system.

SUMMARY OF THE INVENTION

An object of the present invention is to provide a vehicle sound system capable of detecting the noise amount and automatically controlling the volume value in accordance with the noise amount.

In order to achieve the above object, there is provided a vehicle sound system comprising a plurality of tables in each of which the relationship among an output value of an audio signal, a direct-current signal obtained by converting the noise amount, and the value increase amount of the audio signal is stored, a selecting means for selecting a desired table from the plurality of tables, and a control means for controlling a volume based on the characteristic of the table selected by the selecting means.

Once a desired volume control characteristic is selected from a plurality of tables by the selecting means, the volume value is automatically controlled in accordance with the noise amount based on the selected control characteristic.

BRIEF DESCRIPTION OF THE DRAWINGS

FIG. 1 is a block diagram of a vehicle sound system;

FIG. 2 is an operational flow chart;

FIG. 3 is an example of a level determination table; and

FIG. 4 is an example of a control parameter table.

DETAILED DESCRIPTION OF THE PREFERRED EMBODIMENT

Figure 1:
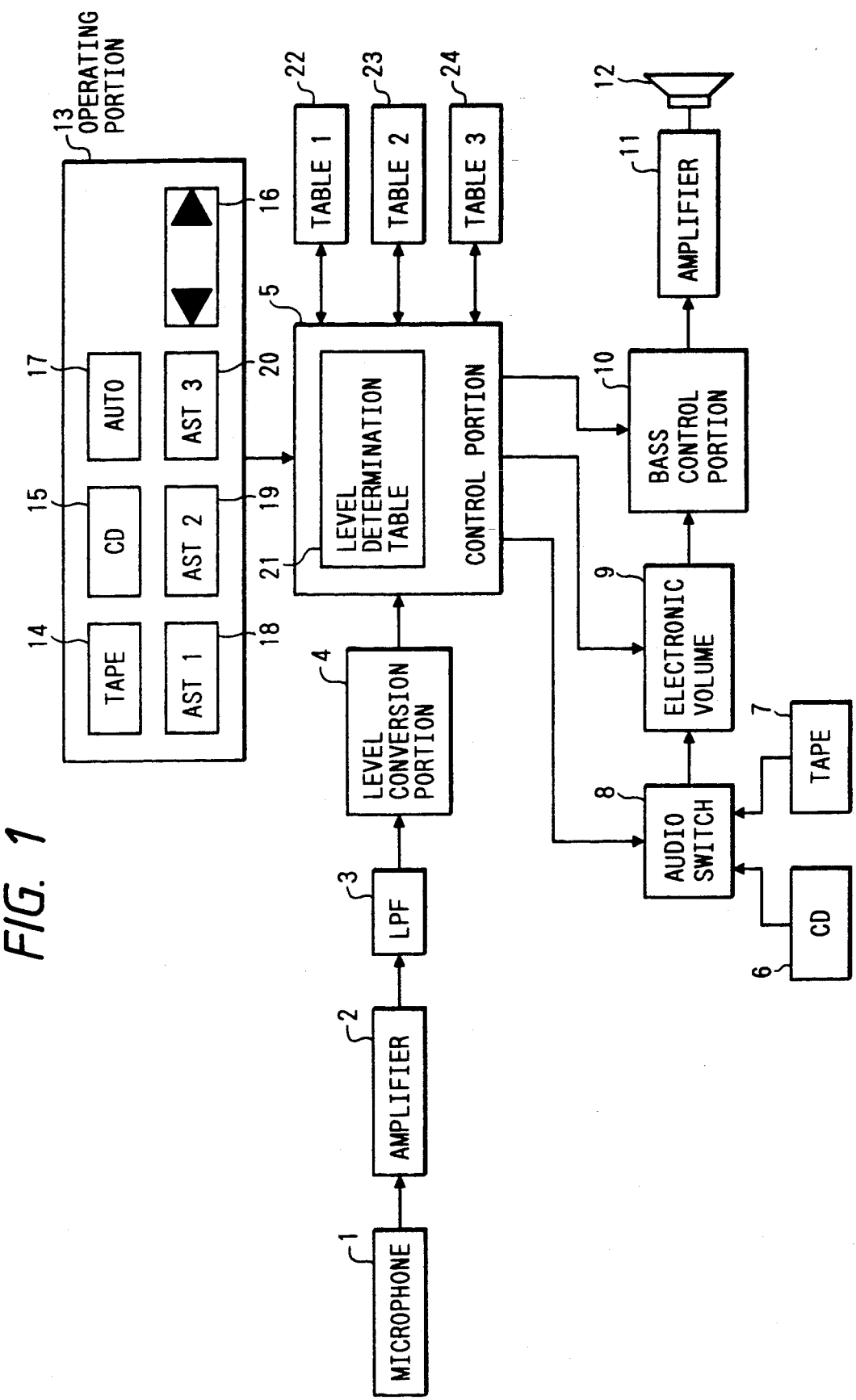
FIGS. 1 to 4 each show an embodiment of the present invention.

FIG. 1 is a block diagram of a vehicle sound system according to the present invention. Referring to FIG. 1, numerals 1, 2 and 3 denote a microphone mounted in the body of the system to detect noise, a microphone amplifier, and a low-pass filter having a low-pass characteristic of, for example, 20 Hz. A level conversion portion 4 converts a noise signal taken out of the low-pass filter 3 into a direct-current voltage value of 0~5 V, and the noise signal converted to the direct-current level signal is input to a control portion 5, described below.

A CD reproduction portion 6 and a tape reproduction portion 7 are both audio sources, and the source selection is performed by switching an audio switch 8 in response to a source selection signal from the control portion 5.

An electronic volume 9 increases and decreases the volume of an audio signal output from the audio sources according to a volume control signal from the control portion 5, and a bass control circuit 10 increases low range components of the audio signal. Numerals 11 and 12 denote an amplifier and a speaker, respectively.

An operating portion 13 operates the body of the sound system, and a tape mode selection key 14 selects the tape reproduction portion 7 as a reproduction source. Numerals 15, 16 and 17 denote a CD mode selection key, a volume up/down key for increasing and decreasing an audio signal, and an automatic volume setting key for setting an automatic volume control function to increase and decrease an audio signal in accordance with the amount of noise, respectively. Characteristic selection keys 18, 19 and 20 select a reference control parameter in carrying out the automatic volume control function, and one of three kinds of control parameters can be selected by pressing any of the keys 18, 19 and 20 in this embodiment.

Figures 2, 3:
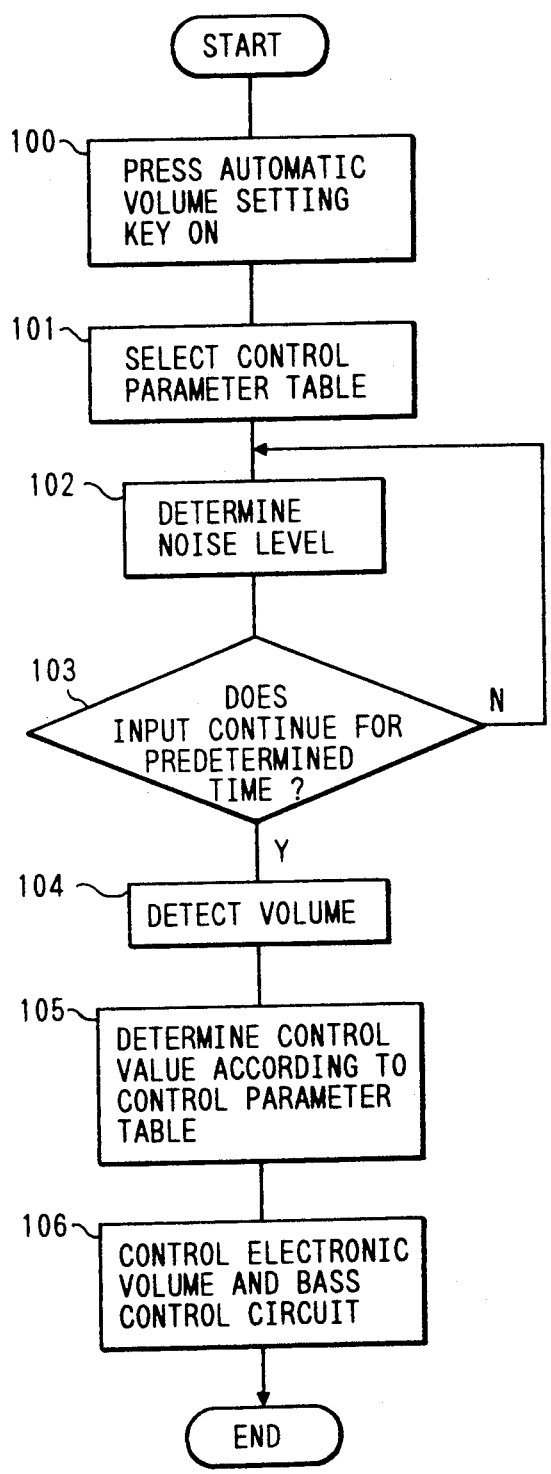
Figure 4:
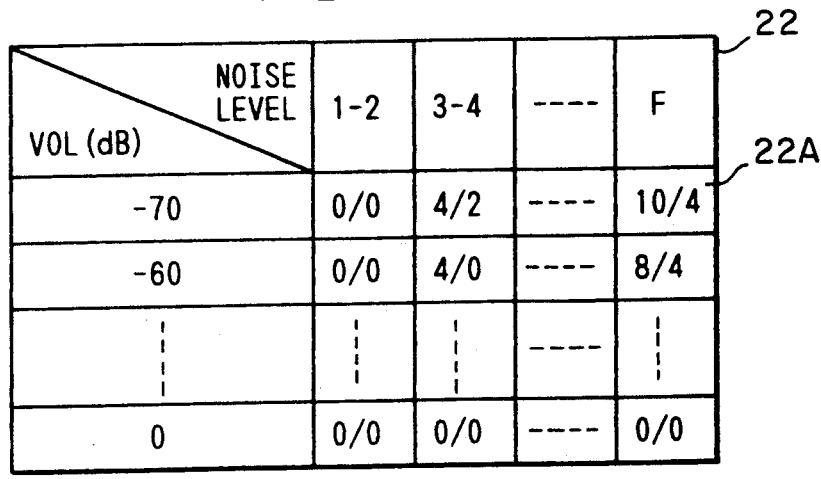
Figure 4:
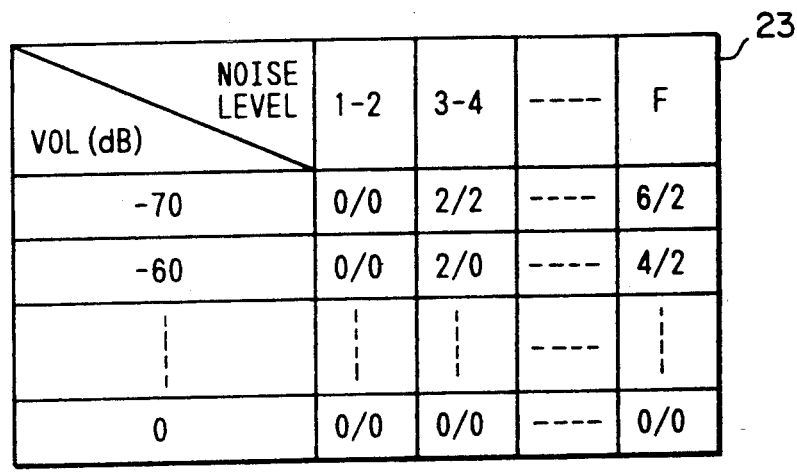
Figure 4:
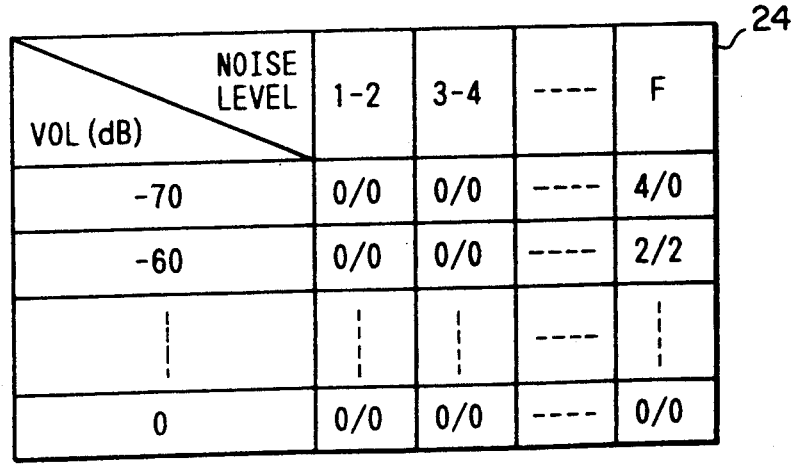
Figure 5:
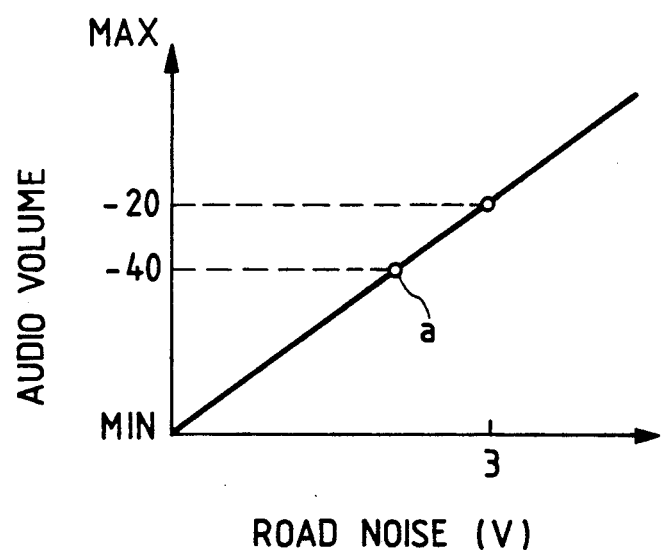
FIG. 5 is a view showing a conventional volume control characteristic for carrying out an automatic volume control function.

The control portion 5 is composed of a microcomputer for controlling operations of the whole vehicle sound system of the present invention, and determines which level of 15 noise levels, divided based on a level determination table 21 stored in a built-in memory, a direct-current level signal input from the level conversion portion 4 belongs to. FIG. 3 shows an example of the level determination table 21. If an input direct-current level signal is a voltage value of, for example, 4.01325 V, the control portion 5 determines that the noise level is D and controls the volume in accordance with the noise level by using a control parameter table, described below. Control parameters in carrying out the automatic volume control function are stored in control parameters tables 22, 23, and 24 each of which are stored in, for example, an EEPROM. FIG. 4 specifically shows the control parameter tables 22, 23 and 24.

The control parameter table 22 is suitable for a vehicle which is likely to be influenced by noise, the control parameter 23 is suitable for a vehicle which is unlikely to be influenced by noise, and the control parameter table 24 is suitable for an audio system having a large output, for example, 200 W. In an actual operation, one of the three control parameter tables is selected. The control portion 5 determines the control parameter to be set in the electronic volume 9 and the bass control circuit 10 in accordance with the noise level determined based on the level determination table 21 and the present volume value set in the electronic volume 9 by the volume up/down key 16. For example, in the case of the control parameter table 22, if the volume value set in the electronic volume 9 is −60 dB and the determined noise level is F, the control portion 5 instructs the electronic volume 9 and the bass control circuit 10 to increase the volume value by 10 dB and the low range component by 4 dB (see 22A) according to the table 22.

Operations of the vehicle sound system shown in the block diagram of FIG. 1 will now be described according to the flow chart shown in FIG. 2.

When the automatic volume control function is carried out, the automatic volume setting key 17 is pressed (Step 100) and a desired control parameter table is selected by using the characteristic selection key 18, 19 or 20 (Step 101). After the selection, the control portion 5 executes the automatic volume control function based on the selected parameter table. If it is assumed that the control parameter table 23 is selected in Step 101, road noise is input from the microphone 1 and converted into a direct-current level signal by the level conversion portion 4 through the amplifier 2 and the low-pass filter 3, and the noise level is determined by the control portion 5 (Step 102). When the noise level is determined, the control portion 5 checks for a predetermined time whether or not noise components of the same level as above are continuously input (Step S103). If the components are not input, it is determined that the noise is an instant noise due to vibrations or the like, and therefore, the automatic volume control is not performed. If the noise components are continuously input, it is determined that the noise is road noise, and the present volume value set in the electronic volume 9 is detected (Step 104). Furthermore, volume control data and low range control data are determined based on the relationship between the noise level determined in Step 102 and the present set volume value according to the control parameter table 18 (Step 105), and the electronic volume 9 and the bass control circuit 10 are controlled (Step 106). The above control operations are performed in accordance with the level of road noise. Since it is unnatural to produce an audio output of a changed volume value immediately after the volume value is changed, a natural volume control is made possible by fading in and out the audio output according to a volume change curve having a predetermined time constant.

As described above, since a vehicle sound system according to the present invention comprises a plurality of tables in each of which the relationship among an output value of an audio signal, a direct-current signal obtained by converting the noise amount and the volume increase amount of the audio signal is stored, a selecting means for selecting a desired table from the plurality of tables, and a control means for controlling a volume based on the characteristic of the table selected by the selecting means, it is possible to perform the automatic volume control function in accordance with the type of a vehicle or a desired characteristic, and thus the performance and operability of the system are enhanced.

What is claimed is:

1. A vehicle sound system comprising:
   detection means for detecting noise;
   level conversion means for converting the noise detected by said detection means into a direct-current level signal;
   audio signal reproduction means for reproducing an audio signal;
   volume control means for increasing or decreasing the audio signal reproduced by said audio signal reproduction means by a volume change amount according to a volume control signal;
   a plurality of tables in each of which a relationship among an output value of the audio signal, the direct-current signal and the volume change amount of the audio signal is stored;
   selection means for selecting a desired table from said plurality of tables; and
   control means for producing said volume control signal for controlling said volume control means according to said direct-current signal and said output value of the audio signal.

2. A vehicle sound system according to claim 1, wherein said control means controls said volume control means when noise components are continuously input for a predetermined time.

3. A vehicle sound system according to claim 1, wherein said control means performs fade-in and fade-out according to a volume change curve having a predetermined time constant in controlling said volume control means.

4. A vehicle sound system according to claim 1, wherein said plurality of tables are prepared in accordance with types of vehicles or sound systems.

5. A vehicle sound system according to claim 1, wherein said plurality of tables each are a control parameter table stored in an EEPROM.

* * * * *